US010983257B1

(12) United States Patent
Colburn et al.

(10) Patent No.: US 10,983,257 B1
(45) Date of Patent: Apr. 20, 2021

(54) FABRICATION OF SELF-ALIGNED GRATING ELEMENTS WITH HIGH REFRACTIVE INDEX FOR WAVEGUIDE DISPLAYS

(71) Applicant: Facebook Technologies, LLC, Menlo Park, CA (US)

(72) Inventors: Matthew E. Colburn, Woodinville, WA (US); Giuseppe Calafiore, Redmond, WA (US); Matthieu Charles Raoul Leibovici, Seattle, WA (US); Maxwell Parsons, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/198,099

(22) Filed: Nov. 21, 2018

Related U.S. Application Data

(60) Provisional application No. 62/589,435, filed on Nov. 21, 2017.

(51) Int. Cl.
| | |
|---|---|
| *H01L 21/308* | (2006.01) |
| *H01L 21/306* | (2006.01) |
| *G03F 7/00* | (2006.01) |
| *G02B 5/18* | (2006.01) |
| *G02B 27/01* | (2006.01) |
| *F21V 8/00* | (2006.01) |

(52) U.S. Cl.
CPC ......... *G02B 5/1857* (2013.01); *G02B 6/0036* (2013.01); *G02B 6/0065* (2013.01); *G02B 27/0172* (2013.01); *G03F 7/001* (2013.01); *H01L 21/306* (2013.01); *H01L 21/308* (2013.01); *H01L 21/3081* (2013.01); *H01L 21/3083* (2013.01); *G02B 2027/0123* (2013.01); *G02B 2027/0178* (2013.01)

(58) Field of Classification Search
None
See application file for complete search history.

(56) References Cited

U.S. PATENT DOCUMENTS

| | | | |
|---|---|---|---|
| 7,554,734 B1 * | 6/2009 | Holm | G02B 5/1833 359/569 |
| 8,507,035 B2 * | 8/2013 | Ryabova | B05D 1/005 427/240 |
| 2005/0208768 A1 * | 9/2005 | Finlay | H01S 5/12 438/689 |
| 2011/0255162 A1 * | 10/2011 | Wu | G02B 5/1809 359/485.01 |
| 2013/0242392 A1 * | 9/2013 | Amirparviz | G02B 5/3058 359/485.05 |

(Continued)

*Primary Examiner* — Stephanie P Duclair
(74) *Attorney, Agent, or Firm* — Fenwick & West LLP

(57) ABSTRACT

A lithographic patterning of a resist is performed to create a mandrel over a substrate. A deposition of one or more functional materials on the mandrel is performed. And each functional material has a respective refractive index. A selective removal of the mandrel is performed to create a plurality of grating elements formed from the one or more functional materials. The plurality of grating elements are self-aligned and form a diffraction grating. Each grating element may have a heterogenous refractive index (e.g., substantial normal to and/or parallel to a surface of the substrate). The diffraction grating may be used in a near-eye display.

16 Claims, 7 Drawing Sheets

(56) References Cited

U.S. PATENT DOCUMENTS

2015/0205026 A1\* 7/2015 Jung ........................ G02B 5/20
                                                    359/485.05
2015/0253570 A1\* 9/2015 Sunnari ................ G02B 6/0035
                                                    359/576

\* cited by examiner

FABRICATION OF SELF-ALIGNED GRATING ELEMENTS WITH HIGH REFRACTIVE INDEX FOR WAVEGUIDE DISPLAYS

CROSS REFERENCE RELATED APPLICATIONS

This application claims the benefit of U.S. Provisional Application No. 62/589,435, filed Nov. 21, 2017, which is incorporated by reference in its entirety.

BACKGROUND

The present disclosure generally relates to waveguide displays, and specifically to a fabrication of self-aligned grating elements with high refractive index for waveguide displays.

Near-eye light field displays project images directly into a user's eye, encompassing both near-eye displays (NEDs) and electronic viewfinders. Conventional near-eye displays (NEDs) generally have a display element that generates image light that passes through one or more lenses before reaching the user's eyes. Additionally, NEDs in augmented reality systems are typically required to be compact and light weight, and to provide large exit pupil with a wide field-of-vision for ease of use. However, conventional methods used in the design of NEDs utilizing three-dimensional optical grating elements in a sub-wavelength regime are difficult to implement due to the strict conditions on the tolerance of alignment error during lithographic patterning. Accordingly, there is a lack of a manufacturing system to fabricate NEDs with optical gratings of a variety of geometries with a desired gradient of refractive indices along any arbitrary direction.

SUMMARY

Fabrication of diffraction gratings including self-aligned grating elements. In some embodiments, a lithographic patterning of a resist is performed (e.g., by a manufacturing system) to create a mandrel over a substrate. A deposition of one or more functional materials on the mandrel is performed. And each functional material has a respective refractive index. A selective removal of the mandrel is performed to create a plurality of grating elements formed from the one or more functional materials. The plurality of grating elements are self-aligned and form a diffraction grating. In some embodiments, the above steps are performed as a method. In some embodiments, a non-transitory computer-readable medium includes instructions that, when executed, cause a manufacturing system including processor to perform the steps.

Each grating element may have a heterogenous refractive index (e.g., substantial normal to and/or parallel to a surface of the substrate). Alternatively, each grating element may have a homogenous refractive index. The diffraction grating may be part of a near-eye display.

Figure 1:
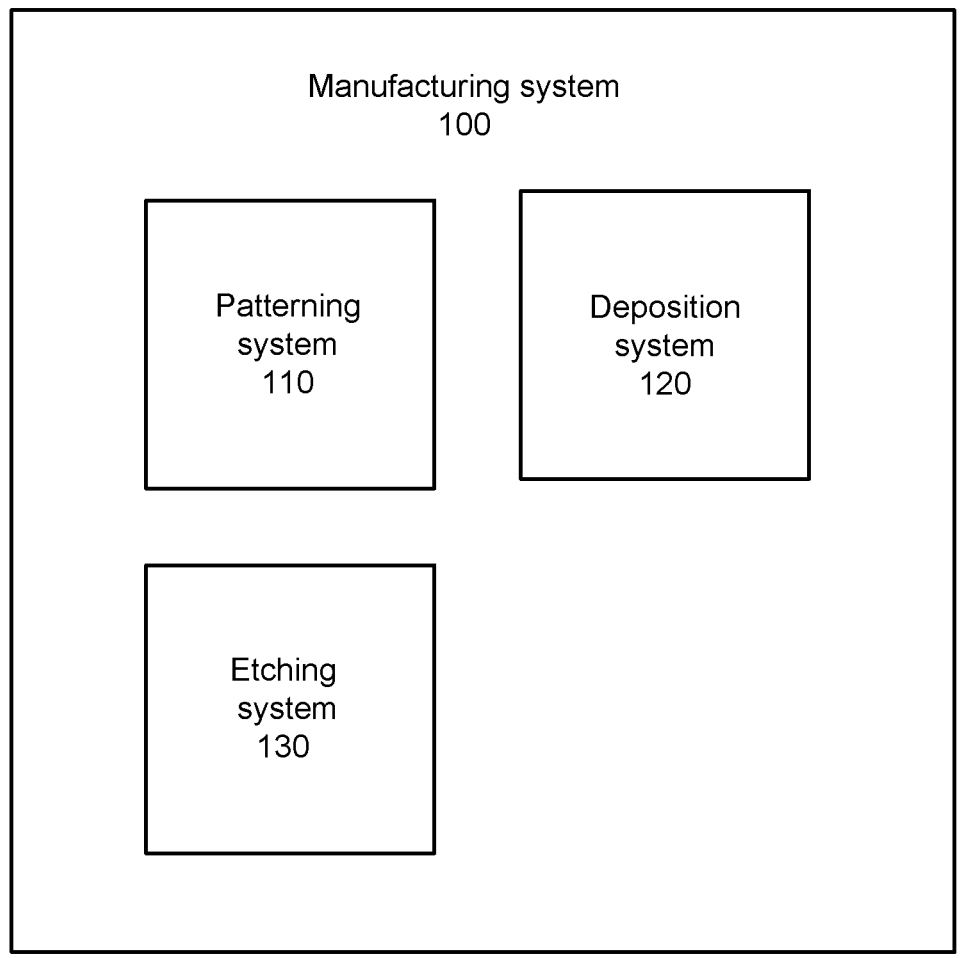
FIG. 1 is a block diagram of a manufacturing system, in accordance with one or more embodiments.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

A manufacturing system for fabricating diffraction gratings that include self-aligned grating elements with a variable refractive index includes a patterning system, a deposition system, and a post-processing system. A grating element is a sub-wavelength three-dimensional (3D) structure. An array of grating elements forms a diffraction grating. The fabrication process produces grating elements such as pillars, holes, etc. In some embodiments, the grating elements may have a variable refractive index. A functional material is spin-coated on a mandrel, creating a conformal coating. The functional material is hardened by either ultraviolet (UV) light or heat. The mandrel is etched and removed selectively, such that the remaining material embodies the desired optical proprieties of the final structure.

In a first embodiment, the manufacturing system imparts a variation in a refractive index by, e.g., sequentially spin coating with different materials of different refractive index. In a second embodiment, the manufacturing system imparts a variation in refractive index by depositing different materials sequentially on the mandrel, polishing (or etching) a top surface, and selectively removing the mandrel.

The embodiments discussed herein are generally in the context of producing a diffraction grating with self-aligned grating elements. However, the same principles may more generally be used to form other self-aligned 3D structures, and these other self-aligned 3D structures may be used for applications other than diffraction gratings.

Various embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a near-eye display (NED) and/or head-mounted display (HMD) connected to a host computer system, a standalone HMD, a standalone NED, a mobile device or computing system, or any other hardware platform capable of providing artificial reality content to one or more viewers.

FIG. 1 is a block diagram of a manufacturing system 100, in accordance with one or more embodiments. The manufacturing system 100 is a set of systems that produces a diffraction grating with an adjustable refractive index in a waveguide display. The manufacturing system 100 includes a patterning system 110, a deposition system 120, an etching system 130, or some combination thereof. The manufacturing system 100 may be similar to a system of fabricating devices used to form an integrated circuit, and may include such components as an etching component, a thin film manufacturing component, an oxidation component, and so on. In some embodiments, the manufacturing system 100 includes a controller (not shown here) that controls each system in the manufacturing system 100.

The patterning system 110 is a system that performs a patterning of a substance formed on a substrate creating a change in geometry of the substance. In some embodiments, the patterning system 110 includes a convection oven, a hot plate, a cool plate, an infrared lamp, a wafer spinner, a mask aligner, an exposure system, a wet bench based developer system, or some combination thereof. In one example, the patterning system 110 includes a pair of convection ovens for processing batches of wafers through hard and soft baking for dehydration purposes at a temperature in the range of 150-200° C., a programmable wafer spinner, a contact-type mask aligner, and an exposure system with a mercury source of intensity close to 25 mW/cm².

In another embodiment, the patterning system 110 includes equipment performing at least one of: an electron beam lithography, an interference lithography, a multi-photon lithography, a scanning probe lithography, or some combination thereof. In a first example, the patterning system 110 is based on electron beam lithography in which a focused beam of electrons performs a scanning of a desired shape on a surface covered with an electron-sensitive film. The focused electron beam changes the solubility of the electron-sensitive film resulting in a selective removal of either the exposed or unexposed regions of the electron-sensitive film by immersing in a solvent. In a second example, the patterning system 110 is based on interference lithography in which an interference pattern consisting of a periodic series of fringes representing intensity minima and maxima between two or more coherent light waves is set up and recorded in a light sensitive material. In some configurations, the patterning system 110 includes one or more devices performing two-beam interference lithography, a three-beam interference lithography, a four-beam interference lithography, a multi-wave interference lithography, or some combination thereof. Accordingly, the patterning system 110 may perform a lithographic patterning of an array of patterns with a hexagonal symmetry, a rectangular symmetry, an aperiodic pattern with a defined spatial frequency spectrum, or some combination thereof. In a third example, the patterning system 110 is based on multi-photon lithography in which a negative-tone or positive-tone photoresists is illuminated with light from a laser of well-defined wavelength without the use of any complex optical systems. The multi-photon lithography process is based on a multi-photon absorption process in a light-sensitive material that is transparent at the wavelength of the laser for creating the lithographic pattern. By scanning and properly modulating the laser, a chemical change occurs at the focal spot of the laser and can be controlled to create an arbitrary three-dimensional periodic or non-periodic pattern. In a fourth example, the patterning system 110 is based on scanning probe lithography in which a scanning probe microscope is used for directly writing the desired lithographic pattern on a light-sensitive material using heat, chemical reaction, diffusion, oxidation, electrical bias, mechanical force, or some combination thereof. In some configurations, the patterning system 110 includes one or more devices performing lithographic patterning on a photo-sensitive material at different locations simultaneously using different types of scanning probe microscope in a parallel fashion for high volume manufacturing.

In alternate embodiments, the patterning system 110 includes an imprinting system that performs a mechanical stamping of a pattern on a substrate. In one example, the imprinting system performs a transfer of a pattern onto the substrate based on a removal of a residual polymeric layer and a subsequent removal of features imprinted into the patterned substrate. The patterning system 110 includes a thermal imprinting system, an ultraviolet imprinting system, a jet and flash imprinting system, a reverse imprinting system, or some combination thereof. The thermal imprinting system is a system that applies a mechanical force on a pre-heated stamp against a thermoplastic polymer that was previously spin-coated on the substrate. The ultraviolet imprinting system is a system that applies an ultraviolet radiation on a low-viscosity, UV-curable polymer (e.g. PDMS, HSQ) to cross-link the polymer followed by releasing the mold from the substrate. The jet and flash imprinting system is a system that dispenses the polymer on the substrate through one or more ink jets at a low pressure and temperature compared to the thermal imprinting system and the ultraviolet imprinting system. The reverse imprinting system is a system that coats a polymer directly onto a template and releases the patterned substrate by tuning the surface energies of the template and the substrate.

The deposition system 120 is a system that adds one or more thin films of functional materials on the substrate patterned by the patterning system 110. The functional material is a material of a select or pre-determined material property such as index of refraction. The index of refraction may be in the range of 1.0 to 4.0. The range of index of refraction covers the range of low-medium-high index films that would be useful for developing self-aligned gratings. Example materials for the functional materials would be GaN, GaP, GaS, $Al_2O_3$, $Ta_2O_5$, $TiO_x$, $Si_xO_yC_wH_z$, $SiO_2$, SiON, etc.

In some embodiments, the deposition system 120 adds a plurality of thin films of materials to form a multi-layered stack with a gradient of refractive indices along any direction based on the differences between the refractive indices of two adjacent layers of functional materials. The deposition system 120 adds the thin films of functional materials on the substrate based on a physical vapor deposition, a chemical vapor deposition, an atomic layer deposition, a spin coating system, or some combination thereof, as described below in conjunction with FIGS. 3-5.

The deposition system 120 includes an electron-beam evaporator, a magnetron sputter, a reactive sputter, a low pressure chemical vapor deposition (LPCVD) reactor, a plasma-enhanced chemical vapor deposition (PECVD) reactor, an atomic layer deposition (ALD) reactor, or some combination thereof. The electron-beam evaporator is based on a form of physical vapor deposition in which a target anode is bombarded with an electron beam given off by a charged tungsten filament under high vacuum. The electron beam causes atoms from the target to transform into the gaseous phase. The atoms from the target then precipitate into a solid form, coating everything in the vacuum chamber within line of sight with a thin layer of the anode material. The magnetron sputter uses strong electric and magnetic fields to confine charged plasma particles close to the surface of the sputter target. In a magnetic field, electrons follow helical paths around magnetic field lines, undergoing more ionizing collisions with gaseous neutrals near the target surface than would otherwise occur. The reactive sputter is based on the sputtered particles undergoing a chemical reaction before coating the substrate. The chemical reaction that the particles undergo is with a reactive gas introduced into the sputtering chamber such as oxygen or nitrogen. The low pressure chemical vapor deposition (LPCVD) reactor is based on a chemical process at a pressure lower than the atmospheric pressure in which the substrate is exposed to one or more volatile precursors which react and/or decompose on the substrate surface to produce the desired deposit. The plasma-enhanced chemical vapor deposition (PECVD) is based on a chemical process that utilizes plasma to enhance the chemical reaction rates of the volatile precursors allowing deposition at lower temperatures. In some configurations, the deposition system 120 performs the deposition of organic coatings such as plasma polymers at a temperature relatively lower than the room temperature. The atomic layer deposition (ALD) reactor is based on a chemical process in which alternating monolayers of two elements are deposited onto a substrate by alternatively pulsing the chemical reactants in a reaction chamber and then chemisorbing in a saturated manner on the surface of the substrate, forming a chemisorbed monolayer. In some configurations, the deposition system 120 includes a controller (not shown here) that controls a number of cycles of pulsing the precursors into the reaction chamber, the deposition time for each pulsing, and the time for purging the reaction chamber after each pulsing.

In some embodiments, the deposition system 120 adds one or more layers of materials on the substrate to form a mandrel, as described below in conjunction with FIGS. 3-5. The mandrel is a mold with an array of three dimensional structures having a feature size in a sub-wavelength regime and different geometrical shapes including, but not restricted to, a slanted profile, a straight profile, a corrugated profile, a triangular profile, a rectangular profile, or any combination thereof. For example, the deposition system 120 adds one or more layers of materials including, but not restricted to, SSQ derivatives, silicon nitride, etc. to form the mandrel. The grating elements in the array may include a pitch in the range of 300 to 700 nm, and the ratio of the feature size to the pitch may be in the range of 0.1 to 0.9.

The etching system 130 is a system that removes one or more thin films of materials deposited on the substrate patterned by the patterning system 110. The etching system 130 is based on a physical process, a chemical process, or some combination thereof. The etching system 130 selectively removes a first set of one or more thin films of materials at a different rate of removal when compared to a second set of one or more thin films of materials in a multi-layered stack of materials deposited on the substrate. The etching system 130 includes a wet bench, an ion milling module, a plasma based reactive ion etching module, a chemical mechanical polishing module, or some combination thereof. In a first configuration, the etching system 130 includes a wet bench which performs a chemical etching using a combination of acids, bases, and solvents at a range of temperatures and concentrations. In a second configuration, the etching system 130 includes an ion milling module that performs a physical removal of a portion of the thin films deposited on the substrate at an extremely low pressure and using a high accelerating potential in order to accelerate electrons impacting the neutral gas atoms with enough energy to ionize the gas atoms. In a third configuration, the etching system 130 includes a plasma based reactive ion etching (RIE) module based on a chemically reactive plasma at a low pressure and an external electromagnetic field to remove one or more thin films of material deposited on the substrate. In a fourth configuration, the etching system 130 includes a chemical mechanical polishing (CMP) module that performs smoothening of one or more thin films of materials based on a combination of chemical and mechanical forces. In some examples, the etching system 130 uses an abrasive and corrosive chemical slurry along with a polishing pad and retaining ring to perform the chemical mechanical polishing on one or more thin films deposited on the substrate patterned by the patterning system 110.

In some embodiments, the deposition system 120 adds one or more thin film of materials of a threshold value of thickness on the substrate patterned by the patterning system 110 which cannot be removed by the etching system 130, as described below in conjunction with FIGS. 3-4. For example, the deposition system 120 deposits a layer of $SiO_2$, Cr, $Si_xN_y$, $TiO_2$, any metal oxide which cannot be removed by the etching system 130.

Figure 2:
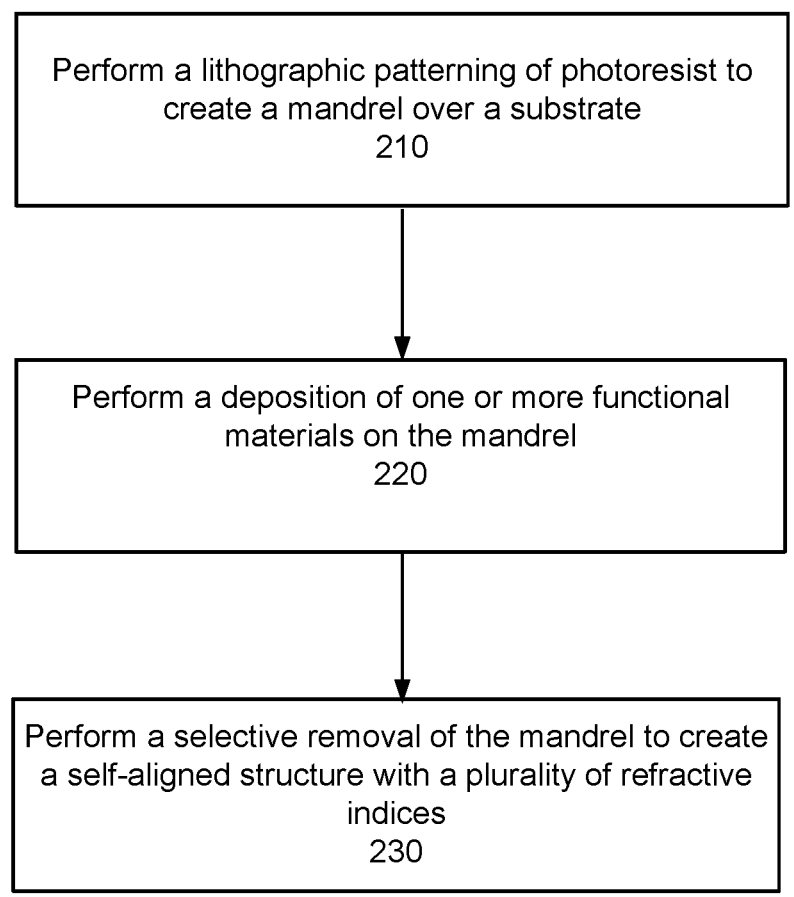
FIG. 2 is a flowchart illustrating the fabrication of self-aligned grating elements by the manufacturing system of FIG. 1, in accordance with one or more embodiments.

FIG. 2 is a flowchart 200 illustrating the fabrication of self-aligned grating elements by the manufacturing system 100 of FIG. 1, in accordance with one or more embodiments. In some embodiments, the manufacturing system 100 includes one or more patterning systems 110, one or more deposition systems 120, one or more etching systems 130, or some combination thereof that are coupled to a controller (not shown here).

The manufacturing system 100 deposits one or more layers of photoresist on the substrate. The manufacturing system 100 performs 210 a lithographic patterning of the deposited photoresist to create a mandrel over the substrate. In some embodiments, the manufacturing system 100 adds one or more thin films of materials that cannot be removed by the manufacturing system 100 before the deposition of the photoresist. For example, the manufacturing system 100 deposits a first thin film of thickness which is chemically inert to the etching system 130. The manufacturing system 100 deposits one or more layers of photoresist over the first thin film. The manufacturing system 100 performs 210 the lithographic patterning of the deposited photoresist to create the mandrel over the substrate.

The manufacturing system 100 performs 220 a deposition of one or more functional materials on the mandrel. For example, in embodiments with different types of functional materials (e.g., having different refractive indices), the manufacturing system 100 performs a deposition of the different functional materials in sequence (e.g., one followed by another, followed by another, and so on). In some embodiments, the manufacturing system 100 performs 220 a spin coating of one or more layers of functional materials on the mandrel, as described in detail below in conjunction with FIGS. 3-4. In alternate embodiments, the manufacturing system 100 performs 220 a conformal coating of one or more layers of functional materials based on chemical vapor deposition, atomic layer deposition, sputtering, or some combination thereof, as described in detail below in conjunction with FIG. 5. In some configurations, the manufacturing system 100 also hardens the functional materials deposited by the deposition system 120 by exposing to UV radiation and/or heat provided by the patterning system 110.

The manufacturing system 100 performs 230 a removal of the mandrel to create a self-aligned structure with a plurality of refractive indices, as described in detail below in conjunction with FIGS. 3-5. In some embodiments, the etching system 130 performs 230 a chemical mechanical polishing of a top portion of the mandrel for planarization before the selective removal of the mandrel, as described above in conjunction with FIG. 1.

Figure 3:
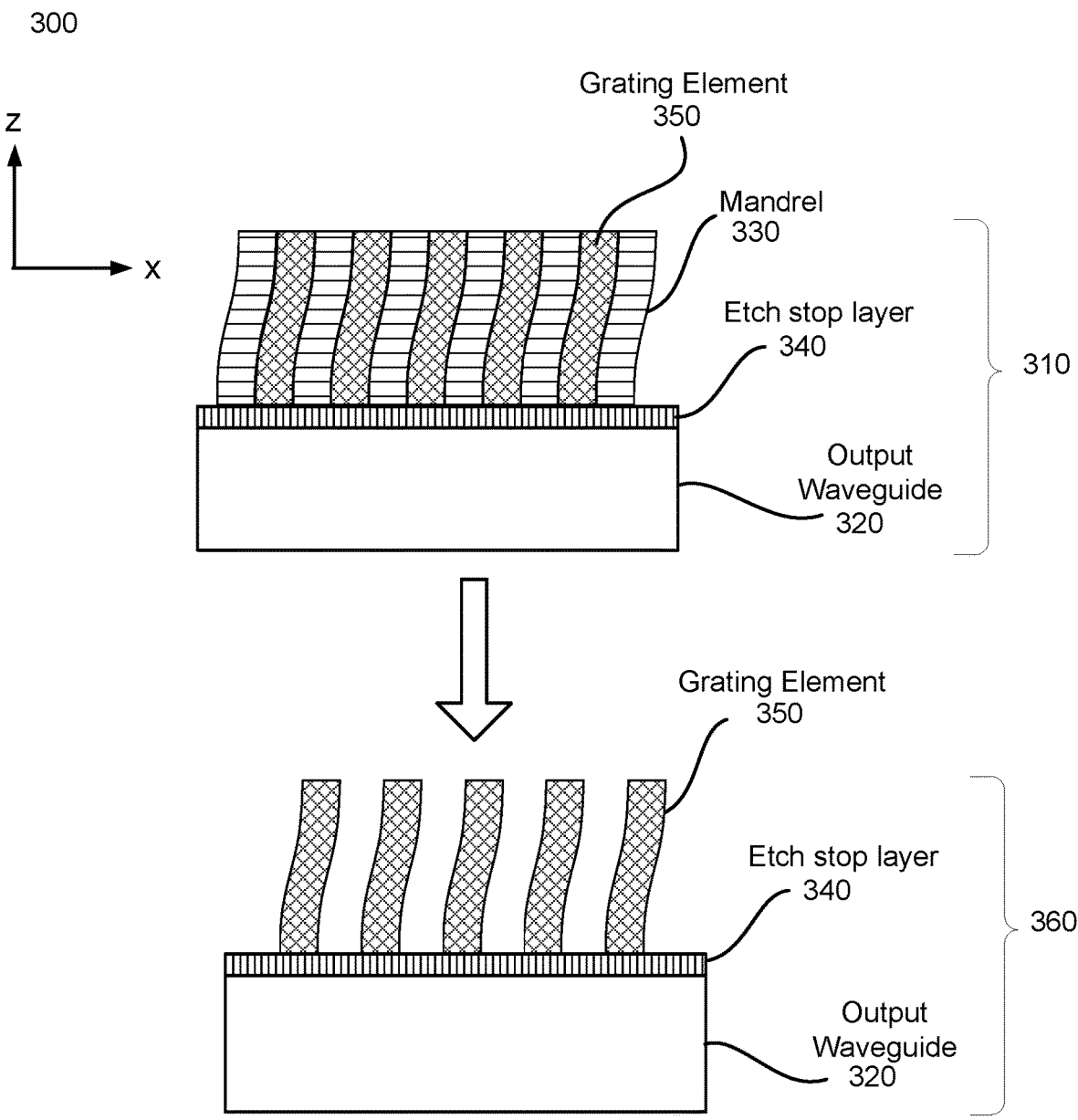
FIG. 3 is an illustration of a self-aligned grating element with a homogenous refractive index fabricated by a manufacturing system, in accordance with one or more embodiments.

FIG. 3 is an illustration 300 of a self-aligned grating element 350 with a homogenous refractive index fabricated by the manufacturing system 100, in accordance with one or more embodiments. In the example of FIG. 3, the manufacturing system 100 performs 310 a deposition of an etch stop layer 340 on an output waveguide 320. The etch stop layer 340 is a layer of materials which cannot be removed by the manufacturing system 100. The output waveguide 320 is an optical waveguide that outputs image light to an eye of a user (e.g., as described below in conjunction with FIG. 7). The manufacturing system 100 performs 310 a lithographic patterning of one or more photoresists to form a mandrel 330, as described above in conjunction with FIGS. 1-2. In alternate embodiments, the manufacturing system 100 performs 310 the lithographic patterning of the mandrel 330 directly on the output waveguide 320. In some configurations, the manufacturing system 100 performs a hardening of photoresists deposited on the mandrel 330 based on an exposure under UV radiation, heat, or some combination thereof.

The manufacturing system 100 performs a spin-coating of the functional material to form a grating element 350. In some examples, the grating element 350 is an optical grating element with a homogeneous value of refractive index in the range of 1.0 to 4.0. The manufacturing system 100 removes 360 the mandrel 330 leaving the grating element 350 alone on the etch stop layer 340. In alternate embodiments, the manufacturing system 100 removes 360 the mandrel 330 leaving the grating element 350 alone on the output waveguide 320.

In the example of FIG. 3, the grating element 350 is one of an array of one dimensional grating elements that together form a one-dimensional (1D) diffraction grating (e.g., diffracts in one dimension). In the illustrated embodiment, each of the grating elements have a homogeneous value of refractive index along the Z-dimension. In the illustrated embodiment, the Z-dimension is a vertical direction that is substantially normal to a surface of a substrate (e.g., the etch stop layer 340) that the plurality of grating elements are deposited on. In alternate embodiments, the grating element 350 can be scaled to be part of an array of two-dimensional grating elements that form a 2D diffraction grating (e.g., diffracts in 2 dimensions), where each of the grating elements have a homogenous value of refractive index along the Z-dimension.

Figure 4:
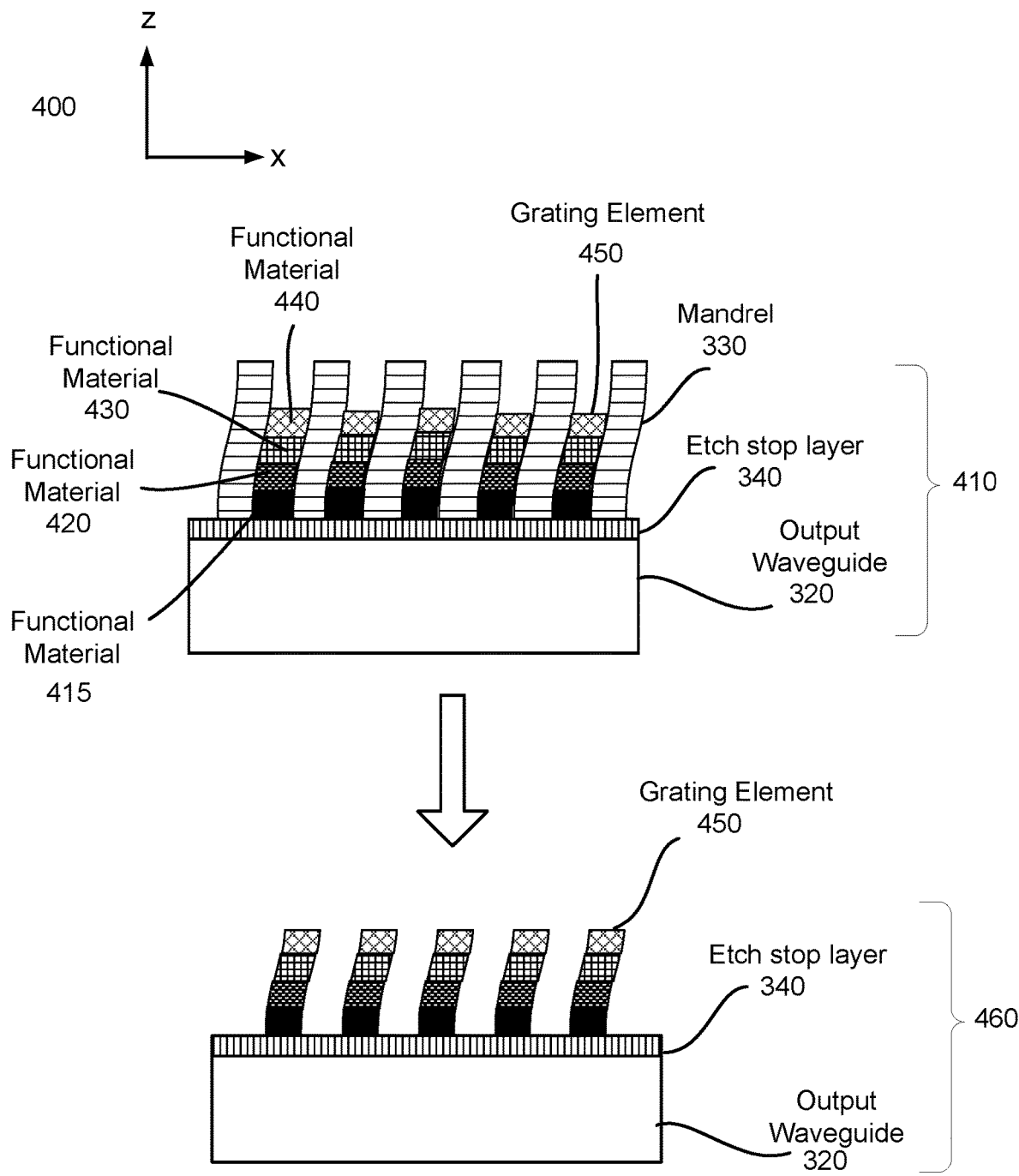
FIG. 4 is an illustration of a self-aligned grating element with a heterogeneous refractive index in a vertical direction fabricated by a manufacturing system, in accordance with one or more embodiments.

FIG. 4 is an illustration 400 of a self-aligned grating element 450 with a heterogeneous refractive index along a vertical direction (e.g., Z-direction) fabricated by the manufacturing system 100, in accordance with one or more embodiments. In the example of FIG. 4, the manufacturing system 100 performs 410 a deposition of the etch stop layer 340 on the output waveguide 320. The manufacturing system 100 performs 410 a lithographic patterning of one or more photoresists to form the mandrel 330, as described above in conjunction with FIGS. 1-2. In alternate embodiments, the manufacturing system 100 performs 410 the lithographic patterning of the mandrel 330 directly on the output waveguide 320. In some configurations, the manufacturing system 100 performs a hardening of photoresists deposited on the mandrel 330 based on an exposure under UV radiation, heat, or some combination thereof.

The manufacturing system 100 performs 410 a spin-coating of a plurality of functional materials to form a grating element 450. In the example of FIG. 4, the manufacturing system 100 performs 410 a spin-coating of a functional material 415, a functional material 420, a functional material 430, and a functional material 440. In alternate examples, the manufacturing system 100 performs 410 a spin-coating of two or more functional materials. The grating element 450 is an optical grating element based on functional materials with a heterogeneous value of refractive index in the range of 1.0 to 4.0 and a spacing between two adjacent grating elements 450 in the range of 300 nm to 700 nm. In some embodiments, the grating element 450 is an optical grating element with a gradient in the refractive index along the Z-dimension.

The manufacturing system 100 removes 460 the mandrel 330 leaving the grating element 450 alone on the etch stop layer 340. In alternate embodiments, the manufacturing system 100 removes 460 the mandrel 330 leaving the grating element 450 alone on the output waveguide 320.

In the example of FIG. 4, the grating element 450 is one of an array of one dimensional grating elements that make up a 1D diffraction grating. In the illustrated embodiment, each of the grating elements have a heterogeneous value of refractive index along the Z-dimension. In the illustrated embodiment, the Z-dimension is a vertical direction that is substantially normal to a surface of a substrate (e.g., the etch stop layer 340) that the plurality of grating elements are deposited on. In alternate embodiments, the grating element 450 can be scaled to be part of an array of 2D grating elements that form a 2D diffraction grating, where each of the grating elements have a heterogeneous value of refractive index along the Z-dimension.

Figure 5:
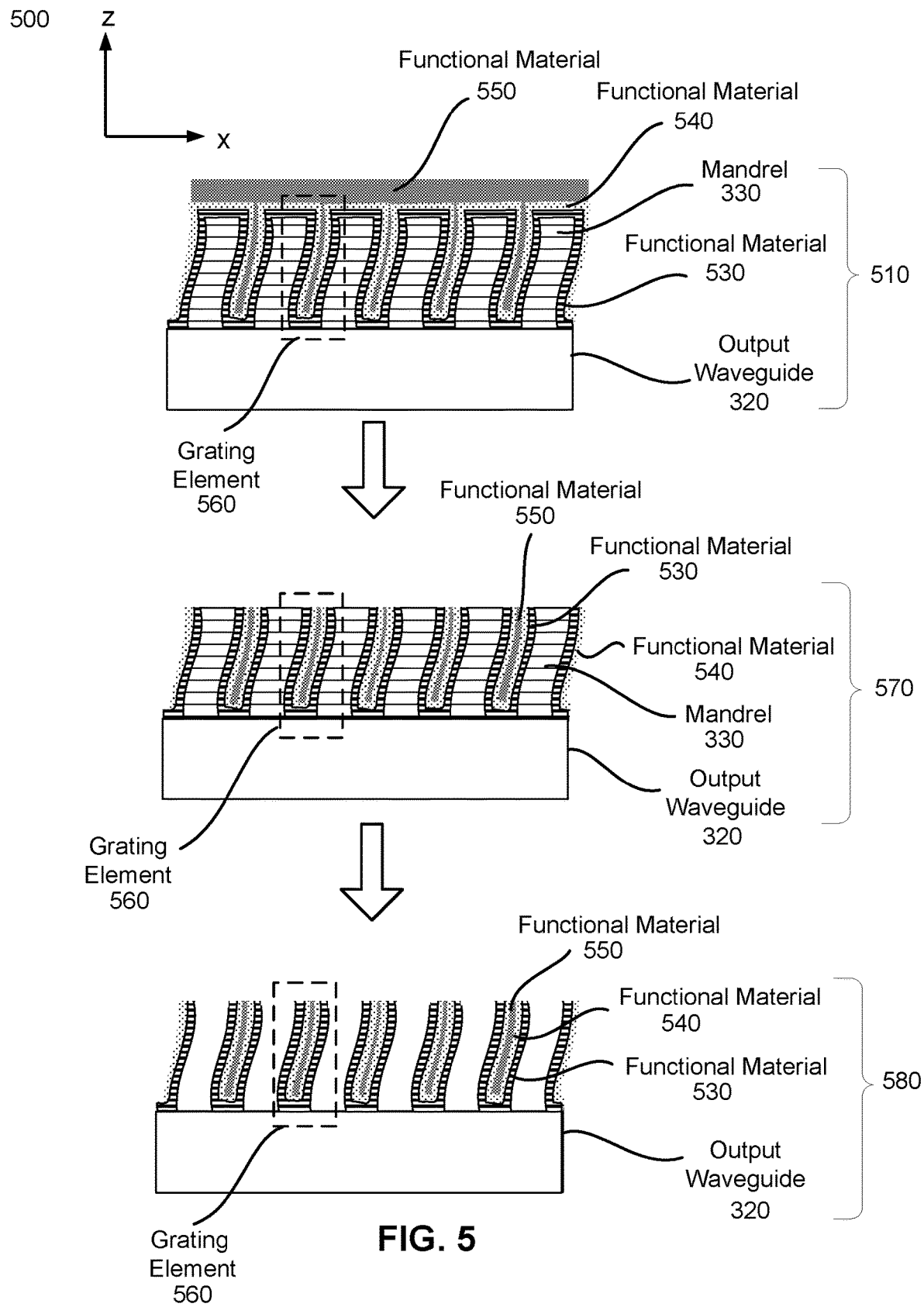
FIG. 5 is an illustration of a self-aligned grating element with a heterogeneous refractive index in a lateral direction fabricated by a manufacturing system, in accordance with one or more embodiments.

FIG. 5 is an illustration 500 of a self-aligned grating element 560 with a heterogeneous refractive index along a lateral direction (e.g., X direction) fabricated by the manufacturing system 100, in accordance with one or more embodiments. In the example of FIG. 5, the manufacturing system 100 performs 510 a lithographic patterning of one or more photoresists to form the mandrel 330 on the output waveguide 320, as described above in conjunction with FIGS. 1-2. In alternate embodiments, the manufacturing system 100 performs 410 the lithographic patterning of the mandrel 330 on an etch stop layer (not shown here). In some configurations, the manufacturing system 100 performs a hardening of photoresists deposited on the mandrel 330 based on an exposure under UV radiation, heat, or some combination thereof.

The manufacturing system 100 performs 510 a deposition of a plurality of functional materials to form a grating element 560. In the embodiment of FIG. 5, the manufacturing system 100 performs 510 a first deposition of a functional material 530, a second deposition of a functional material 540, and a third deposition of a functional material 550. Each of the functional materials 530, 540 and 550 is a thin film of a material added based on a conformal deposition performed by the manufacturing system 100. In one example, the functional material 530, the functional material 540, and the functional material 550 is made of a material of a select or pre-determined material property such as index of refraction. The grating element 560 is an optical grating element based on functional materials with a heterogeneous value of refractive index in the range of 1.0 to 4.0. In some embodiments, the grating element 560 is an optical grating element with a gradient in the refractive index along the X-dimension.

The manufacturing system 100 performs 570 a removal of a portion of the functional material 550. The manufacturing system 110 performs a removal of a portion of the one or more functional materials such that portions of the mandrel are exposed. In some configurations, the etching system 130 of the manufacturing system 100 performs 570 the removal of the portion of the functional material 550 of a target thickness based on a polishing of the functional material 550 as described above in conjunction with FIGS. 1-2.

The manufacturing system 100 performs 580 a removal of the mandrel 330 using the etching system 130, as described above in conjunction with FIG. 1, resulting in the grating element 560 alone present on the output waveguide 320. In alternate embodiments, the manufacturing system 100 performs 580 a removal of the mandrel 330 leaving the grating element 560 alone on an etch stop layer (not shown here) deposited on top of the output waveguide 320.

In the example of FIG. 5, the grating element 560 is one of an array of one dimensional grating elements that form a portion of a 1D diffraction grating. Each of the array of grating elements have a heterogeneous value of refractive index along the X-dimension. In the illustrated embodiment, the X-dimension is a horizontal direction that is substantially parallel to a surface of a substrate (e.g., the output waveguide 320) that the plurality of grating elements are deposited on. In alternate embodiments, the grating element 560 can be scaled to be part of an array of 2D grating elements that form a 2D diffraction grating, where each of the grating elements have a heterogeneous value of refractive index along the X-dimension.

Figure 6:
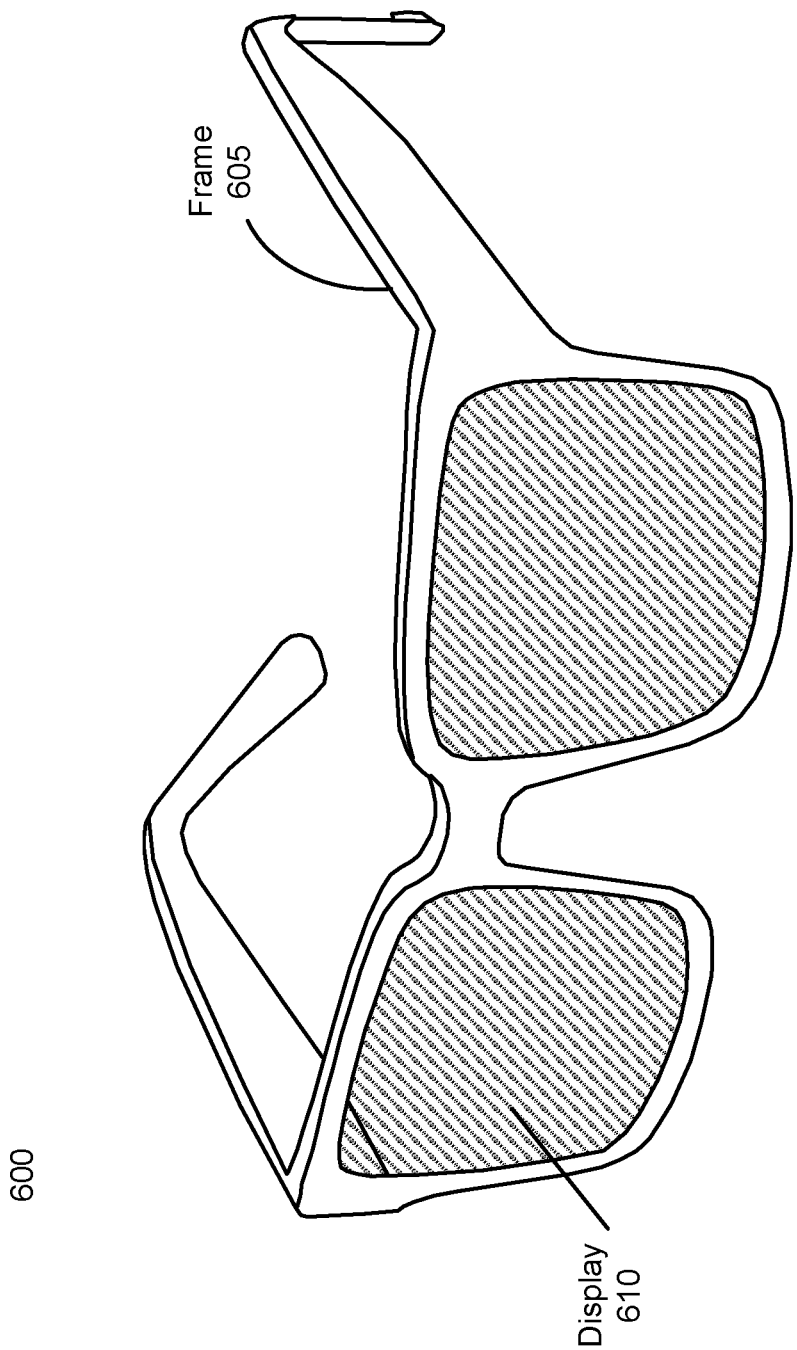
FIG. 6 is a diagram of a near-eye-display (NED) including at least one diffraction grating fabricated by a manufacturing system, in accordance with one or more embodiments.

FIG. 6 is a diagram of a near-eye-display (NED) 600 including at least one diffraction grating fabricated by the manufacturing system 100, in accordance with one or more embodiments. The NED 600 presents media to a user. Examples of media presented by the NED 600 include one or more images, video, audio, or some combination thereof. In some embodiments, audio is presented via an external device (e.g., speakers and/or headphones) that receives audio information from the NED 600, a console (not shown), or both, and presents audio data based on the audio information. The NED 600 is generally configured to operate as a VR NED. However, in some embodiments, the NED 600 may be modified to also operate as an augmented reality (AR) NED, a mixed reality (MR) NED, or some combination thereof. For example, in some embodiments, the NED 600 may augment views of a physical, real-world environment with computer-generated elements (e.g., images, video, sound, etc.).

The NED 600 shown in FIG. 6 includes a frame 605 and a display 610. The frame 605 includes one or more optical elements which together display media to users. The display 610 is configured for users to see the content presented by the NED 600. As discussed below in conjunction with FIG. 7, the display 610 includes at least one source assembly to generate an image light to present media to an eye of the user. The source assembly includes, e.g., a source, an optics system, or some combination thereof.

Figure 7:
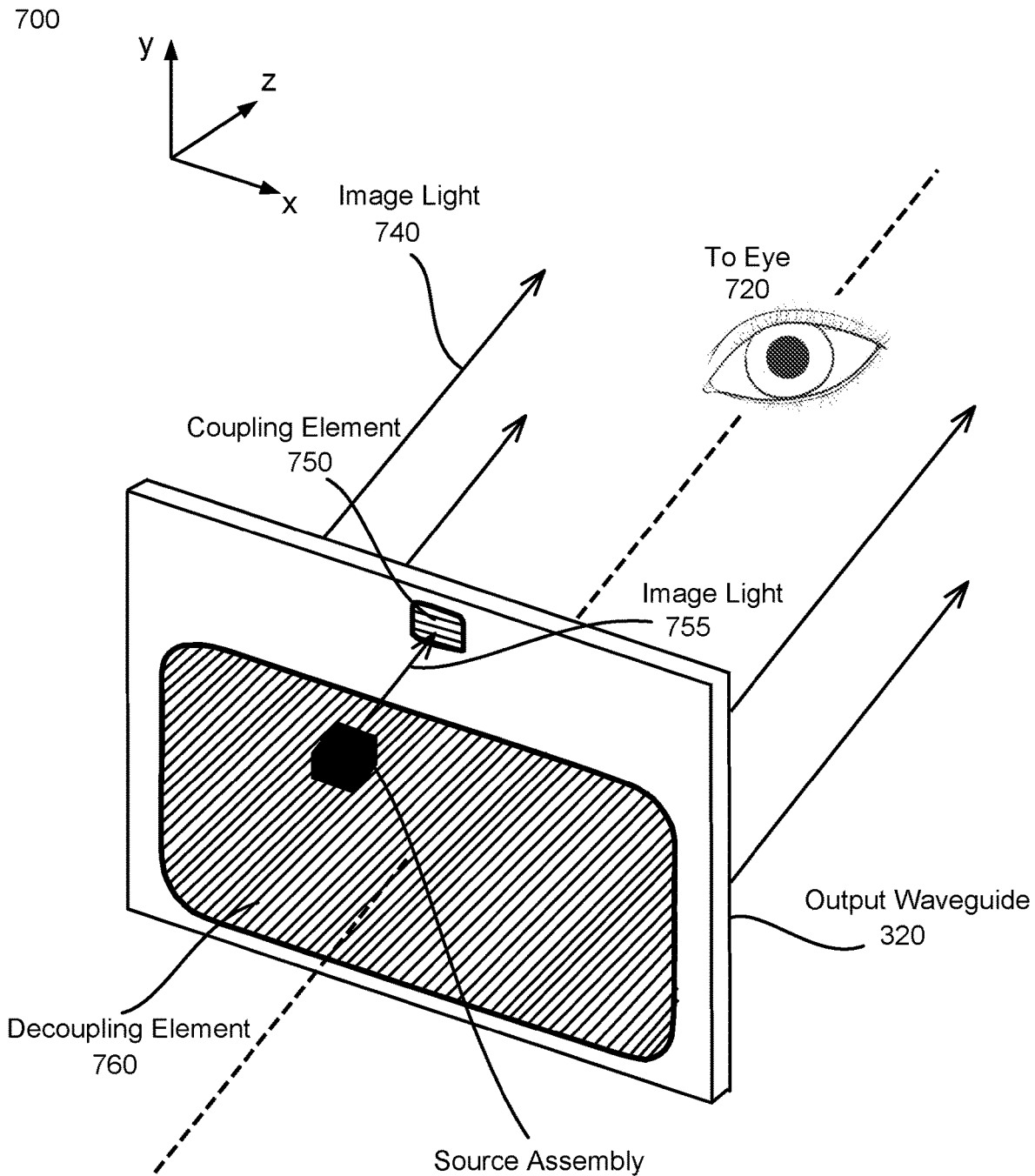
FIG. 7 illustrates an isometric view of a waveguide display including at least one diffraction grating fabricated by a manufacturing system, in accordance with one or more embodiments.

FIG. 7 illustrates an isometric view of a waveguide display 700 including at least one diffraction grating fabricated by the manufacturing system 100, in accordance with one or more embodiments. The diffraction grating may be a 1D or 2D diffraction grating fabricated as described above with regard to FIG. 2, 3, 4, or 5. In some embodiments, the waveguide display 700 (may also be referred to as a scanning waveguide display) is a component of the NED 600. In alternate embodiments, the waveguide display 700 is part of some other NED, or other system that directs display image light to a particular location.

The waveguide display 700 includes the output waveguide 320 and a source assembly 710. The source assembly 710 generates image light. The source assembly 710 includes a source array and an optics system (not shown here). The source assembly 710 generates and outputs an image light 755 to a coupling element 750 of the output waveguide 320.

The output waveguide 320 is an optical waveguide that outputs image light to an eye 720 of a user. The output waveguide 320 receives the image light 755 at one or more coupling elements 750, and guides the received input image light to one or more decoupling elements 760. In some embodiments, the coupling element 750 couples the image light 755 from the source assembly 710 into the output waveguide 320. At least one of the coupling element 750 and the decoupling element 760 includes a diffraction grating manufactured as described above with regard to one of FIGS. 1-5. The coupling element 750 may be, e.g., a diffraction grating, a holographic grating, some other element that couples the image light 755 into the output waveguide 320, or some combination thereof. For example, in embodiments where the coupling element 750 is diffraction grating, the pitch of the diffraction grating is chosen such that total internal reflection occurs, and the image light 755 propagates internally toward the decoupling element 760. For example, the pitch of the diffraction grating may be in the range of 300 nm to 600 nm. The manufacturing system 100 performs the fabrication of the coupling element 750 in a self-aligned fashion with a gradient of refractive indices as described above in conjunction with FIGS. 1-5.

The decoupling element 760 decouples the total internally reflected image light from the output waveguide 320 as image light 740. The decoupling element 760 may be, e.g., a diffraction grating, a holographic grating, some other element that decouples image light out of the output waveguide 320, or some combination thereof. For example, in embodiments where the decoupling element 760 is a diffraction grating, the pitch of the diffraction grating is chosen to cause incident image light to exit the output waveguide 320. An orientation and position of the image light 740 exiting from the output waveguide 320 is controlled by changing an orientation and position of the image light 755 entering the coupling element 350. For example, the pitch of the diffraction grating may be in the range of 300 nm to 600 nm. The manufacturing system 100 performs the fabrication of the decoupling element 760 in a self-aligned fashion with a gradient of refractive indices as described above in conjunction with FIGS. 1-5.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
   performing a lithographic patterning of a resist to create a mandrel over a substrate;
   performing a spin-coating of a plurality of layers of functional materials on the mandrel to create a plurality of grating elements, each of the functional materials having a respective refractive index of a plurality of refractive indexes;
   removing portions of the functional materials prior to a removal of the entire mandrel; and
   removing the entire mandrel from the substrate to create a self-aligned structure without the mandrel that forms a diffraction grating with the plurality of refractive indexes.

2. The method of claim 1, wherein performing the spin-coating of the functional materials on the mandrel, comprises:
   performing, in sequence, a spin-coating of at least two of the functional materials that have different respective refractive indexes,
   wherein each of the plurality of grating elements has a heterogeneous refractive index along one direction.

3. The method of claim 1, wherein performing the spin-coating of the functional materials on the mandrel, comprises:
   performing, in sequence, a spin-coating of at least of the two functional materials that have different respective refractive indexes,
   wherein each of the plurality of grating elements has a heterogeneous refractive index along a vertical direction that is substantially normal to a surface of the substrate that the plurality of grating elements is deposited on.

4. The method of claim 1, wherein the substrate includes a waveguide.

5. The method of claim 4, wherein the diffraction grating occupies a portion of the waveguide, the method further comprising:
   performing a deposition of an etch stop layer onto the portion of the waveguide prior to the performing the lithographic patterning of the resist.

6. The method of claim 4, wherein the waveguide is part of a near-eye display.

7. The method of claim 4, wherein the waveguide is an output waveguide.

8. The method of claim 1, wherein the diffraction grating is a 2-dimensional diffraction grating.

9. A non-transitory computer-readable medium configured to store computer readable instructions that, when executed by a manufacturing system including a processor, cause the manufacturing system to:
   perform a lithographic patterning of a resist to create a mandrel over a substrate;
   perform a spin-coating of a plurality of layers of functional materials on the mandrel to create a plurality of grating elements, each of the functional materials having a respective refractive index of a plurality of refractive indexes;
   remove portions of the functional materials prior to a removal of the entire mandrel; and
   remove the entire mandrel from the substrate to create a self-aligned structure without the mandrel that forms a diffraction grating with the plurality of refractive indexes.

10. The computer-readable medium of claim 9, further comprising instructions to:
    perform, in sequence, a spin-coating of at least two of the functional materials that have different respective refractive indexes,
    wherein each of the plurality of grating elements has a heterogeneous refractive index along one direction.

11. The computer-readable medium of claim 9, further comprising instructions to:
    perform, in sequence, a spin-coating of at least two of the functional materials that have different respective refractive indexes, wherein each of the plurality of grating elements has a heterogeneous refractive index along a vertical direction that is substantially normal to a surface of the substrate that the plurality of grating elements is deposited on.

12. The computer-readable medium of claim 9, wherein the substrate includes a waveguide.

13. The computer-readable medium of claim 12, wherein the diffraction grating occupies a portion of the waveguide, and further comprising instructions to:
   perform a deposition of an etch stop layer onto the portion of the waveguide prior to the performing the lithographic patterning of the resist.

14. The computer-readable medium of claim 12, wherein the waveguide is part of a near-eye display.

15. The computer-readable medium of claim 12, wherein the waveguide is an output waveguide.

16. The computer-readable medium of claim 9, wherein the diffraction grating is a 2-dimensional grating.

* * * * *